(12) United States Patent
Klipp et al.

(10) Patent No.: US 9,557,652 B2
(45) Date of Patent: Jan. 31, 2017

(54) USE OF COMPOSITIONS COMPRISING A SURFACTANT AND A HYDROPHOBIZER FOR AVOIDING ANTI PATTERN COLLAPSE WHEN TREATING PATTERNED MATERIALS WITH LINE-SPACE DIMENSIONS OF 50 NM OR BELOW

(71) Applicant: BASF SE, Ludwigshafen (DE)

(72) Inventors: Andreas Klipp, Lambsheim (DE);
Andrei Honciuc, Ludwigshafen (DE);
Günter Oetter, Frankenthal (DE);
Christian Bittner, Bensheim (DE)

(73) Assignee: BASF SE, Ludwigshafen (DE)

( * ) Notice: Subject to any disclaimer, the term of this patent is extended or adjusted under 35 U.S.C. 154(b) by 53 days.

(21) Appl. No.: 14/652,120

(22) PCT Filed: Dec. 4, 2013

(86) PCT No.: PCT/IB2013/060616
§ 371 (c)(1),
(2) Date: Jun. 14, 2015

(87) PCT Pub. No.: WO2014/091363
PCT Pub. Date: Jun. 19, 2014

(65) Prior Publication Data
US 2015/0323871 A1    Nov. 12, 2015
US 2016/0238944 A9    Aug. 18, 2016

Related U.S. Application Data

(60) Provisional application No. 61/737,123, filed on Dec. 14, 2012.

(51) Int. Cl.
*G03F 7/42*    (2006.01)
*H01L 21/02*   (2006.01)
(Continued)

(52) U.S. Cl.
CPC ............. *G03F 7/422* (2013.01); *C11D 1/835* (2013.01); *C11D 1/94* (2013.01); *C11D 11/0047* (2013.01);
(Continued)

(58) Field of Classification Search
CPC .................. C11D 11/0047; H01L 21/027
(Continued)

(56) References Cited

U.S. PATENT DOCUMENTS 6,379,746 B1 *  4/2002  Birch ................. C03C 17/28
                                              427/154
6,670,107 B2   12/2003  Lachowski
(Continued)

FOREIGN PATENT DOCUMENTS

CN      1947066 A       4/2007
DE   102004009530 A1    9/2005
(Continued)

OTHER PUBLICATIONS

Namatsu, Hideo, et al., "Dimensional limitations of silicon nanolines resulting from pattern distortion due to surface tension of rinse water," Appl. Phys. Lett. 66 (20), pp. 2655-2656, May 15, 1995.
(Continued)

*Primary Examiner* — Gregory Webb
(74) *Attorney, Agent, or Firm* — Armstrong Teasdale LLP

(57) ABSTRACT

In a method of treating a substrate including patterns having line-space dimensions of 50 nm or below, the substrate is rinsed by an aqueous composition including at least one non-ionic surfactant A and at least one hydrophobizer B. The at least one surfactant A has an equilibrium surface tension of 10 mN/m to 35 mN/m, determined from a solution of the at least one surfactant A in water at the critical micelle concentration. The hydrophobizer B is selected so that the
(Continued)

contact angle of water to the substrate is increased by contacting the substrate with a solution of the hydrophobizer B in water by 5-95° compared to the contact angle of water to the substrate before such contacting.

22 Claims, 4 Drawing Sheets

(51) Int. Cl.
  H01L 21/027 (2006.01)
  C11D 1/835 (2006.01)
  C11D 1/94 (2006.01)
  C11D 11/00 (2006.01)
  G03F 7/20 (2006.01)
  G03F 7/40 (2006.01)
(52) U.S. Cl.
  CPC ............ *G03F 7/2041* (2013.01); *G03F 7/405* (2013.01); *H01L 21/02057* (2013.01); *H01L 21/0273* (2013.01)
(58) Field of Classification Search
  USPC .......................................................... 510/175
  See application file for complete search history.

(56) References Cited

U.S. PATENT DOCUMENTS

| | | | |
|---|---|---|---|
| 7,053,030 B2 | 5/2006 | Kim et al. | |
| 7,129,199 B2 | 10/2006 | Zhang et al. | |
| 7,169,323 B2* | 1/2007 | Parent | H01L 21/31111 252/79.1 |
| 7,195,863 B2 | 3/2007 | Takano et al. | |
| 7,314,853 B2 | 1/2008 | Lee et al. | |
| 7,521,405 B2 | 4/2009 | Zhang et al. | |
| 7,741,260 B2 | 6/2010 | Koshiyama et al. | |
| 7,795,197 B2 | 9/2010 | Sawada et al. | |
| 8,008,358 B2 | 8/2011 | Kirsch et al. | |
| 8,049,022 B2 | 11/2011 | Hierse et al. | |
| 8,822,553 B1 | 9/2014 | Wenzel | |
| 9,101,142 B1 | 8/2015 | Chauhan et al. | |
| 2005/0074709 A1 | 4/2005 | Lee et al. | |
| 2005/0151820 A1* | 7/2005 | Sirringhaus | B82Y 30/00 347/107 |
| 2005/0176605 A1* | 8/2005 | Lassila | C08G 65/2609 510/175 |
| 2005/0233922 A1 | 10/2005 | Jung et al. | |
| 2008/0063870 A1* | 3/2008 | O'Rear | C09D 4/00 428/411.1 |
| 2008/0193876 A1 | 8/2008 | Sawada et al. | |
| 2008/0280230 A1 | 11/2008 | Chang et al. | |
| 2008/0299487 A1 | 12/2008 | Chang | |
| 2009/0004608 A1 | 1/2009 | Sawada et al. | |
| 2009/0197201 A1 | 8/2009 | Hierse et al. | |
| 2009/0264525 A1 | 10/2009 | Hierse et al. | |
| 2010/0248164 A1 | 9/2010 | Kumagai et al. | |
| 2011/0088594 A1 | 4/2011 | Claus et al. | |
| 2012/0111233 A1 | 5/2012 | Hierse et al. | |

FOREIGN PATENT DOCUMENTS

| | | |
|---|---|---|
| DE | 102011114650 A1 | 5/2012 |
| DE | 102011114651 A1 | 5/2012 |
| EP | 1553454 A2 | 7/2005 |
| EP | 1580607 A2 | 9/2005 |
| JP | 4437068 B2 | 3/2010 |
| WO | 02067304 A1 | 8/2002 |
| WO | 2005103830 A1 | 11/2005 |
| WO | 2008003446 A1 | 2/2008 |
| WO | 2008047719 A1 | 4/2008 |
| WO | 2012101545 A1 | 8/2012 |

OTHER PUBLICATIONS

International Search Report and Written Opinion for International Application No. PCT/IB2013/060616 mailed Apr. 3, 2014.
International Search Report for PCT/IB2013/060616, dated Feb. 28, 2014.

* cited by examiner

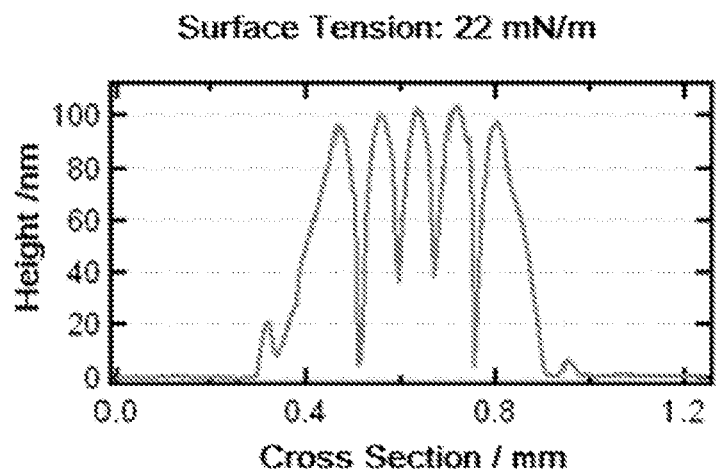
Fig. 4
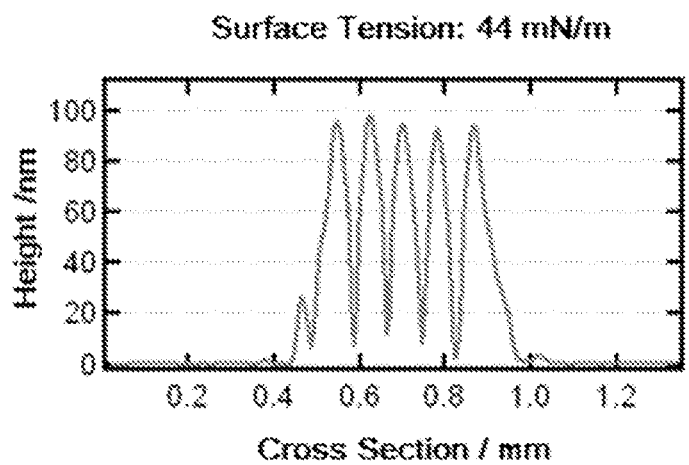

USE OF COMPOSITIONS COMPRISING A SURFACTANT AND A HYDROPHOBIZER FOR AVOIDING ANTI PATTERN COLLAPSE WHEN TREATING PATTERNED MATERIALS WITH LINE-SPACE DIMENSIONS OF 50 NM OR BELOW

CROSS-REFERENCE TO RELATED APPLICATIONS

This application is a National Stage entry from International Application Number PCT/IB2013/060616 filed Dec. 4, 2013 and claims priority to U.S. Patent Application 61/737,123 filed Dec. 14, 2012, the disclosures of which are hereby expressly incorporated by reference in their entireties.

Use of compositions comprising a surfactant and a hydrophobizer for avoiding anti pattern collapse when treating patterned materials with line-space dimensions of 50 nm or below.

The present invention is directed to a composition useful in processes for manufacturing integrated circuits devices, optical devices, micromachines and mechanical precision devices, in particular to avoid pattern collapse.

BACKGROUND OF THE INVENTION

In the process of manufacturing ICs with LSI, VLSI and ULSI, patterned material layers like patterned photoresist layers, patterned barrier material layers containing or consisting of titanium nitride, tantalum or tantalum nitride, patterned multi-stack material layers containing or consisting of stacks e.g. of alternating polysilicon and silicon dioxide layers, and patterned dielectric material layers containing or consisting of silicon dioxide or low-k or ultra-low-k dielectric materials are produced by photolithographic techniques. Nowadays, such patterned material layers comprise structures of dimensions even below 22 nm with high aspect ratios.

Photolithography is a method in which a pattern on a mask is projected onto a substrate such as a semiconductor wafer. Semiconductor photolithography typically includes the step of applying a layer of a photoresist on a top surface of the semiconductor substrate and exposing the photoresist to actinic radiation, in particular UV radiation of a wavelength of, for example, 193 nm, through the mask. In order to extend the 193 nm photolithography to the 22 nm and the 15 nm technology node, immersion photolithography has been developed as a resolution enhancement technique. In this technique, the air gap between the final lens of the optical system and the photoresist surface is replaced by a liquid medium that has a refractive index greater than one, e.g., ultra pure water with a refractive index of 1.44 for the wavelength of 193 nm. However, in order to avoid leaching, water-uptake and pattern degradation, a barrier coating or a water resistant photoresist must be used. These measures however add to the complexity of the manufacturing process and are therefore disadvantageous.

Beside the 193 nm-immersion lithography other illumination techniques with significant shorter wavelength are considered to be solutions to fulfil the needs of further downscaling of the feature sizes to be printed of 20 nm node and below. Beside e-Beam exposure the Extreme Ultraviolet Lithography with a wavelength of approx. 13.5 nm seem to be the most promising candidate to replace immersion lithography in the future. After exposure the subsequent process flow is quite similar for immersion and EUV lithography as described in the following abstract.

A post-exposure bake (PEB) is often performed to allow the exposed photoresist polymers to cleave. The substrate including the cleaved polymer photoresist is then transferred to a developing chamber to remove the exposed photoresist, which is soluble in aqueous developer solutions. Typically, a developer solution such as tetramethylammonium hydroxide (TMAH) is applied to the resist surface in the form of a puddle to develop the exposed photoresist. A deionized water rinse is then applied to the substrate to remove the dissolved polymers of the photoresists. The substrate is then sent to a spin drying process. Thereafter, the substrate can be transferred to the next process step, which may include a hard bake process to remove any moisture from the photoresist surface.

Irrespective of the exposure techniques the wet chemical processing of small patterns however involves a plurality of problems. As technologies advance and dimension requirements become stricter and stricter, photoresist patterns are required to include relatively thin and tall structures or features of photoresists, i.e., features having a high aspect ratio, on the substrate. These structures may suffer from bending and/or collapsing, in particular, during the spin dry process, due to excessive capillary forces of the liquid or solution of the rinsing liquid deionized water remaining from the chemical rinse and spin dry processes and being disposed between adjacent photoresist features. The maximum stress σ between small features caused by the capillary forces can be described according to Namatsu et al. Appl. Phys. Lett. 66(20), 1995 as follows:

$$\sigma = \frac{6 \cdot \gamma \cdot \cos\theta}{D} \cdot \left(\frac{H}{W}\right)^2$$

wherein γ is the surface tension of the fluid, θ is the contact angle of the fluid on the feature material surface, D is the distance between the features, H is the height of the features, and W is the width of the features.

To lower the maximum stress, generally the following approaches exist:
(a) lower the surface tension γ of the fluid,
(b) lower the contact angle of the fluid on the feature material surface.

In another approach to lower the maximum stress σ for immersion lithography may include using a photoresist with modified polymers to make it more hydrophobic. However, this solution may decrease the wettability of the developing solution.

Another problem of the conventional photolithographic process is line edge roughness (LER) and line width roughness (LWR) due to resist and optical resolution limits. LER includes horizontal and vertical deviations from the feature's ideal form. Especially as critical dimensions shrink, the LER becomes more problematic and may cause yield loss in the manufacturing process of IC devices.

Due to the shrinkage of the dimensions, the removal of particles in order to achieve a defect reduction becomes also a critical factor. This does not only apply to photoresist patterns but also to other patterned material layers, which are generated during the manufacture of optical devices, micromachines and mechanical precision devices.

An additional problem of the conventional photolithographic process is the presence of watermark defects. Watermarks may form on the photoresist as the deionized water or rinse liquid cannot be spun off from the hydrophobic surface of the photoresist. The photoresist may be hydrophobic particularly in areas of isolated, or non-dense, patterning. The watermarks have a harmful effect on yield and IC device performance.

U.S. Pat. No. 7,741,260 B2 discloses a rinse fluid, consisting of at least one component that has the capability of changing the contact angle of the structures from a 40 to at least 70, thus minimizing the pattern collapse of the structures.

Many further additives for cleaning solutions are known from the prior art. However, none of these use a combination of two kinds of additives. By way of example several compounds are proposed in U.S. Pat. No. 7,238,653 B2, U.S. Pat. No. 7,795,197 B2, WO 2002067304 A1, U.S. Pat. No. 7,314,853 B2, JP 4437068 B2, WO 2008047719 A1, WO 2006/025303 A1, WO 2005/103830 A1, U.S. Pat. No. 7,129,199 B2, US 2005/0176605 A1, U.S. Pat. No. 7,053,030 B2, U.S. Pat. No. 7,195,863 B2, DE 10 2004 009 530 A1, EP 1 553 454 A2, US 2000/53172 A1, and US2005/0233922 A1.

U.S. Pat. No. 7,521,405 B2 discloses surfactants that can be used in rinse formulations, like acetylenic diol compounds and many other types surfactants. It is further discussed that the lowest pattern collapse is achieved if the product of the surface tension and the cosine of the contact angle of the surfactant formulation to the photoresist surface and is low.

US 2010/0248164 A1 discloses a rinse solution for preventing pattern collapse consisting of an anionic surfactant, an amine compound like alkanolamines or quaternary ammonium compounds, and water, for preventing the swelling of the patterned critical dimensions.

U.S. Pat. No. 6,670,107 B2 discloses a method for the reduction of defects in an electronic device by using a rinse solution comprising surfactants in a concentration less than or equal to the critical micelle concentration. It is generally mentioned that mixtures of cationic and non-ionic surfactants and mixtures of anionic and non-ionic surfactants may be used.

US 2009/0004608 A1 discloses an anti-pattern collapse detergent formulation, containing a nitrogen-containing cationic surfactant in combination with an anionic surfactant. It is discussed that this combination enables a reduced content of surfactant, thus preventing photoresist swelling, while maintaining a low surface tension.

While reducing the overall surfactant concentration may be advantageous some notable disadvantages of mixing the anionic and cationic surfactants may follow:
1. The formation of insoluble precipitates due to strong interaction between the opposite charged entities and formation of a very hydrophobic complex, which can precipitate out of the formulation, or affect the medium and long-term stability of the anionic-cationic surfactant formulations.
2. In-situ generation of fine particles and aggregates (precipitates) may occur if the anionic and cationic surfactants are in concentrations of near or above the solubility product of the anionic/cationic complex, or due to local variations in concentration.
3. The Cleaning solutions may not prevent dirt, or particle re-deposition on the surface due to reduced capacity of increasing the magnitude of the surface zeta potential as compared to pure anionic, or cationic surfactants.
4. Unpredictable system in terms of system stability and surfactant-surface interaction.

OBJECTS OF THE INVENTION

It is an object of the present invention to provide a method for manufacturing integrated circuits for nodes of 50 nm and lower, in particular for nodes of 32 nm and lower and, especially, for nodes of 22 nm and lower, which method no longer exhibits the disadvantages of prior art manufacturing methods.

In particular, the compounds according to the present invention shall allow for
the immersion photolithography of photoresist layers,
the developing of the photoresist layers exposed to actinic radiation through a mask
the chemical rinse of patterned material layers
comprising patterns with a high aspect ratio and line-space dimensions of 50 nm and less, in particular, of 32 nm and less, especially, of 22 nm and less, without causing pattern collapse, an increase of LER and LWR and watermark defects.

The components according to the present invention should allow for a significant reduction of LER and LWR by smoothing the roughness of the surfaces of the developed photoresist patterns. It should also allow for the efficient prevention and/or the removal of watermark defects on patterned material layers, in particular but not limited to photoresist patterns. Furthermore it should allow for the efficient removal of particles in order to achieve a significant defect reduction on patterned material layers, in particular but not limited to photoresist patterns.

SUMMARY OF THE INVENTION

A first embodiment of the present invention is the use of an aqueous composition comprising at least one non-ionic or zwitterionic surfactant A and at least one hydrophobizer B for treating substrates comprising patterns having line-space dimensions of 50 nm or below, wherein
(a) the surfactant A has an equilibrium surface tension of 10 mN/m to 35 mN/m, determined from a solution of surfactant A in water at the critical micelle concentration, and
(b) the hydrophobizer B is selected so that the contact angle of water to the substrate is increased by contacting the substrate with a solution of the hydrophobizer B in water by 5-95° compared to the contact angle of water to the substrate before such contacting.

Another embodiment of the present invention is a process for manufacturing integrated circuit devices, optical devices, micromachines and mechanical precision devices has been found, the said method comprising the steps of
(1) providing a substrate having patterned material layers having line-space dimensions of 50 nm and less and aspect ratios of greater or equal 2;
(2) contacting the substrate at least once with an aqueous solution comprising at least a surfactants A and a hydrophobizer B as defined above,
and
(3) removing the aqueous solution from the contact with the substrate.

In view of the prior art, it was surprising and could not be expected by the skilled artisan that the objects of the invention could be solved by the use or method according to the invention.

The present invention completely avoids, in a surprising way, all the disadvantages of the prior art by using combinations of non-ionic and cationic surfactants. The fundamental difference is that the intrinsic cause for the insolubility of surfactant mixture is eliminated. The present invention uses mixtures of non-ionic with cationic compounds that are selected according to the defined criteria. Formulations based on non-ionic compounds with cationic ones have a better long-term stability, better particle removal efficiency, reduced or no intrinsic particle generation ability compared to formulations based on anionic-cationic surfactant mixtures.

The surfactant A and hydrophobizer B may be in relatively high concentrations without the risk of precipitation of at least one of the components.

The use of at least two different additives, a non-ionic surfactant A and a hydrophobizer B according to the invention is particularly useful for patterned developed photoresist layers comprising patterns having line-space dimensions of 50 nm or less, particularly of 32 nm or less and, most particularly 22 nm or less.

Furthermore, the use of at least two different additives, a surfactant A and a hydrophobizer B according to the invention is particularly useful for aspect ratios greater or equal 2 in the case of photoresist structures, and, in particular, greater or equal 10 in the case of non-photoresist structures, without causing pattern collapse, line edge roughness (LER), line width roughness (LWR) and watermark defects.

It has to be noted that the cleaning solutions comprising the at least two different additives according to the present invention are generally useful for avoiding anti pattern collapse of photoresist structures as well as of non-photoresist patterns with high aspect ratios stacks (HARS).

In the photoresist case anti-pattern collapse, LER and LWR reduction and defect removal. (typical aspect ratios are from 2 to 4). For the HARS case we need anti pattern collapse and defect reduction/cleaning (typical aspect ratios are greater or equal 10). However, the fundamental concept to suppress pattern collapse by using at least two different surfactants according to the present invention is the same.

Quite to the contrary, the method of the invention allowed for a significant reduction of LER and LWR by smoothing the roughness of the surfaces of the developed photoresist patterns caused, for the efficient prevention and/or the removal of watermark defects not only on photoresist patterns, but also on other patterned material layers, and the efficient removal of particles whereby a significant defect reduction not only on photoresist patterns but also on other patterned material layers could be achieved.

DETAILED DESCRIPTION OF THE INVENTION

The present invention is directed to a composition particularly suitable for manufacturing patterned materials comprising sub 32 nm sized features like integrated circuit (IC) devices, optical devices, micromachines and mechanical precision devices, in particular IC devices.

Any customary and known substrates used for manufacturing IC devices, optical devices, micromachines and mechanical precision devices can be used in the process of the invention. Preferably, the substrate is a semiconductor substrate, more preferably a silicon wafer including a silicon-gallium wafer, which wafers are customarily used for manufacturing IC devices, in particular IC devices comprising ICs having LSI, VLSI and ULSI.

The composition is particularly suitable for treating substrates having patterned material layers having line-space dimensions of 50 nm and less, in particular, 32 nm and less and, especially, 22 nm and less, i.e. patterned material layers for the sub-22 nm technology nodes. The patterned material layers preferably have ratios above 2, preferably above 10, even more preferably above 50. In particular, when the patterned material layers comprise or consist of photoresist structures the ratios are above 2 and when they comprise or consist of non-photoresist structures the ratios are above 10. Most preferably, the aspect ratio is in the range of up to 75, as for example, for 15 nm flash devices.

The composition according to the present invention may be applied to substrates of any patterned material as long as structures tend to collapse due to their geometry.

By way of example, the patterned material layers may be (a) patterned developed photoresist layers, (b) patterned barrier material layers containing or consisting of ruthenium, titanium nitride, tantalum or tantalum nitride, (c) patterned multi-stack material layers containing or consisting of layers of at least two different materials selected from the group consisting of silicon, polysilicon, silicon dioxide, low-k and ultra-low-k materials, high-k materials, semiconductors other than silicon and polysilicon and metals, and d) patterned dielectric material layers containing or consisting of silicon dioxide or low-k or ultra-low-k dielectric materials.

The compositions according to the present invention comprise at least a surfactant A and at least a compound B. The hydrophobizer B mainly acts as a hydrophobizer of the surface to be rinsed but may nevertheless have properties of a surfactant. Both, the surfactant A and the hydrophobizer B are also referred to as additives.

The compositions comprising the at least two different additives are preferably aqueous solutions.

"Aqueous" means that the solvent comprises water, preferably deionized water and, most preferably ultrapure water as the main solvent. The aqueous composition may contain water-miscible polar organic solvents, albeit only in such minor amounts that do not jeopardize the aqueous nature of the composition. It is preferred that the solvent essentially consists of water, preferably deionized water and, most preferably ultrapure water. Example of ultrapure water with concentration of 5 ppt (ng/kg), or better, anion concentration 5 ppb (ng/g), or better, total organic content (TOC) 50 ppb (ng/g), or better and contains particles of >0.2 mm under 10000 per ml.

"Critical micelle concentration" or "CMC" refers to the concentration of a surfactant in water above which the surface tension remains substantially invariant with increasing surfactant concentration. Such critical micelle concentration is well known to those skilled in the art. Typically, the amount of surfactants used in the present invention is less than about 5000 ppm, preferably less than about 1000 ppm, more preferably less than 500 ppm and most preferably less than about 250 ppm. The critical micelle concentrations may be determined by monitoring the decrease of the air-liquid interfacial tension vs. surfactant concentration, where the surface tension is measured according to ISO 304-1985 (2) by the plate method.

Surfactant A

The non-ionic surfactant according to the present invention (also referred to as surfactant A) may be selected from any types of surfactants capable of achieving a lowered equilibrium surface tension, as compared to about 72 mN/m of water at 25° C., of 35 mN/m or below, preferably 25 mN/m or below, more preferably 30 mN/m or below, and most preferably 20 mN/m or below, determined at and above their critical micelle concentration (CMC).

Typically the CMC value is determined with variety of methods, such as monitoring the surface tension vs surfactant concentration, conductivity, etc. and it relates to the concentration of surfactant at which the molecules start aggregating into entities called micelles. Further addition of surfactant, above the CMC value will not further lower the air-liquid interfacial tension, but rather contribute to the nucleation and growth of micellar entities. In the current case the CMC value was measured by monitoring the surface tension vs surfactant concentration, at 25° C. and no foam conditions, using the plate method, according to the ISO 304.

The solution of surfactant A in water at the CMC or higher should have a good wetting ability on the target substrate, or preferably total wetting at about 25° C.

Furthermore, the solution containing surfactant A around the CMC or higher should reach a value of the contact angle to the target substrate of less than 35°, after 30 seconds from the initial droplet formation. Preferably, the contact angle of the solution containing surfactant A at the CMC value or above is from 0° to 30°, more preferably from 0° to 20°, most preferably 0° to 10° after 30 seconds or less.

The surfactant A is non-ionic. "Non-ionic" as used herein means that the overall compound is uncharged and does not require any counter-ion to be electrically neutral. The surfactant A may be zwitterionic, amphoteric, in which the charges are internally compensated, or intramolecularly non-ionic. Preferably the surfactant A is intramolecularly non-ionic.

a linker X selected from the group consisting of covalent bonds, silicon atoms, nitrogen atoms, phosphorus atoms, oxygen atoms, sulfur atoms and bivalent organic linking groups $L^A$; $R^f$, $M^A$ and $X^A$ constituting a hydrophobic group $D^A$ of the general formula $(R^fX^A—)_aM^A$-, wherein the index a is an integer of at least 3. The surfactant A may contain at least one hydrophobic group $D^A$.

In a particular embodiment the at least one hydrophobic group $D^A$ may be bonded to at least one hydrophilic group $E^A$ selected from the group consisting of anionic groups, cationic groups and nonionic groups; via a linker $Y^A$ selected from the group consisting of covalent bonds, silicon atoms, nitrogen atoms, phosphorus atoms, oxygen atoms, sulfur atoms or bivalent organic linking groups $L^A$; $D^A$, $Y^A$ and $E^A$ constituting the surfactant A of the general formula $(D^AY^A—)_bE^A$), wherein the index b is an integer of at least 1.

By way of example, such short branched perfluoroalkyl surfactants (A1) are described in more detail in WO 2012/101545, WO 2008/003443 A1, WO 2008/003445 A1, WO 2008/003446 A2 and WO 2009/149807 A1 and US 2009/0264525 A1, WO 2010/149 262 A1, WO 2006/072401 A1, DE 10 2011 114 651 A1, DE 10 2011 114 650 A1, which are incorporated herein by reference.

Silicon based surfactants (A2) may be selected from siloxane surfactants of general formula A-IIa and A-IIb, without being restricted thereto:

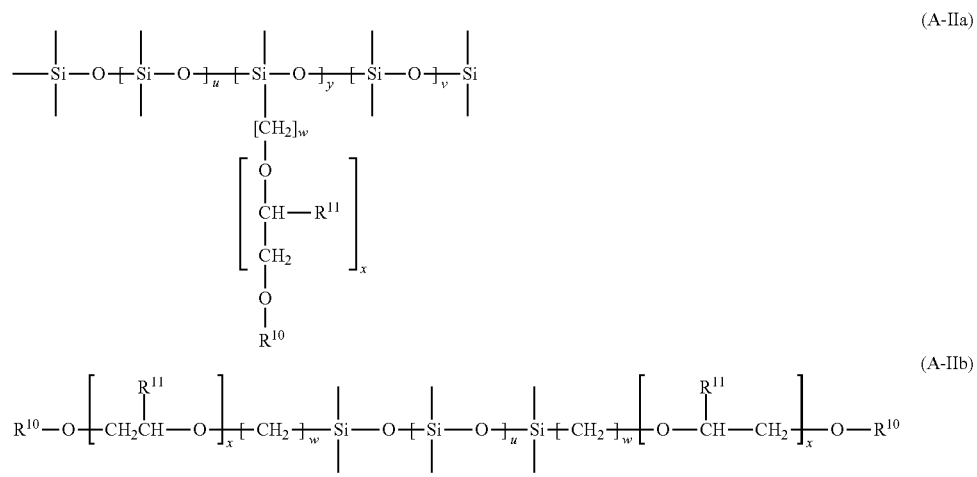

The surfactant A may be selected from but is not limited to:
(A1) short branched perfluoroalkyl surfactants,
(A2) tri-siloxane surfactants,
(A3) alkoxylated alkyl and perfluoro alkyl surfactants,
(A4) alkyl polyglycosides,
(A5) amine oxides, and
(A6) acetylenic diols.

Short branched perfluoroalkyl surfactants (A1) may be but are not limited to surfactants comprising at least three short-chain perfluorinated groups $R^f$ selected from the group consisting of trifluoromethyl, pentafluoroethyl, 1-heptafluoropropyl, 2-heptafluoropropyl, and pentafluorosulfanyl.

Preferably, the perfluorinated groups $R^f$ are bonded to the same multi-valent central moiety M.

More preferably, the perfluorinated groups $R^f$ in the surfactant A are bonded to the multi-valent central moiety M via wherein
u, v are an integers independently selected of from 0 to 5, preferably 0 to 3, most preferably 0 or 1,
w is an integer of from 0 to 6, preferably of from between 1 to 6, most preferably of from 1 to 3,
x is an integer of from 1 to 22, more preferably 4 to 15 and most preferably 6 to 10 d,
y is an integer of from 1 to 5, preferably of from 1 to 3, most preferably 1,
$R^{10}$ is a selected from H or a $C_1$ to $C_{10}$ alkyl group,
$R^{11}$ is selected from H, methyl or ethyl, preferably H or methyl, most preferably H.

Formula Ia covers the so called trisiloxane type and rake type siloxane surfactants. Formula Ib covers the so called ABA-type siloxane surfactants.

The trisiloxane surfactants are preferred. Such trisiloxane surfactants are available under the trade names: Silwet™

L-77, Tegopren™ 5847, etc. Since the stability of the polysiloxane surfactants is low at high pHs, the formulations stable to hydrolysis should only be used at mild basic pHs.

Alkoxy terminated copolymers of ethylene oxide and propylene oxide surfactants (A3) have the general formula A-III $$(R^{12}\text{—O})_c\text{-(EO)}_a(\text{PO})_b H \quad \text{(A-III)}$$

wherein
$R^{12}$ is an c-valent group selected from $C_4$ to $C_{30}$ alkyl, which may optionally be fluorinated or perfluorinated,
EO oxyethanediyl (also called oxyethylene),
PO oxypropanediyl (also called oxypropylene),
a is an integer of from 1 to 100,
b is an integer of from 0 to 100,
c is an integer of from 1 to 6.

Preferably, $R^{10}$ is selected from $C_6$ to $C_{25}$ alkyl, most preferably from $C_8$ to $C_{18}$.

Preferably, a is an integer from 1 to 20, most preferably of from 1 to 10.

Preferably, b is an integer from 0 to 20, most preferably of from 0 to 10.

Preferably c is 1 to 4, more preferably 1 or 2, most preferably 1.

Such copolymers of ethylene oxide and propylene oxide may comprise block, random, alternating or any other structural order of EO and PO units.

Such surfactants A3 are, for example, available from BASF under the trademarks Plurafac®, Lutensol®, Lutensit®, and Emulan®. Perfluorinated ethoxylated surfactants from DuPont, such as Capstone FS 30, FS 31, FS 34, FS 35, Zonyl FSH, Zonyl FS 300, Zonyl FSN, Zonyl FSN-100, Zonyl FSO, Zonyl FSO-100, which provide very low surface tension and excellent wetting properties.

Further non-limiting examples are amine oxide surfactants, such as Aromox® of Akzo Nobel and Dehyton PL of BASF, perfluorinated alkyl amine oxide surfactants from DuPont such as Capstone™ FS-51, 2-sulfosuccinic acid esters (Available from BASF as Lutensit® ABO), Lutensit®ALBA (available from BASF).

From the category of perfluorinated surfactants the Capstone™ FS-30, 35, 51, 61, 64, 65, Zonyl FS™ 300, 510, 610, 640 from DuPont are to be mentioned.

Alkyl polyglucosides or polysaccharides (A4) are described by the general formula A-IV:

$$R^{21}\text{O}(C_nH_{2n}\text{O})_j(Z)_k \quad \text{(A-IV)}$$

wherein
$R^{21}$ is a hydrophobic group selected from the group consisting of alkyl, alkylphenyl, hydroxyalkylphenyl, in which the alkyl group contain from about 10 to 18, preferably from about 12 to 14 carbon atoms,
n is preferably 2 or 3, preferably 2,
j is from 0 to 10, preferably 0,
k is from 1 to 8, preferably 1 to 3,
Z is selected from a hexose, a glucose, a derivative of glucose, a sucrose, sorbitan, preferably a glucose.

Examples of commercial polyglucosides are Glucopon 225 CS with C8/10 alkyl chain and a degree of polymerization of 1.4. Glucopon 225DK/HH with linear alkyl with C10 (decyl) and a surface tension of 29 mN/m at 0.1 wt %, Glucopon 650 EC C12 (lauryl glycoside) and other type of may be comprised in the Plantapon™, Glucopon™, Plantacare™, T-MAZ™, brands of BASF.

Suitable amine oxides (A5), which are considered non-ionic type surfactants, include but are not limited to, those compounds having the formula A-V:

$$R^{41}\text{—}\underset{\underset{R^{43}}{|}}{\overset{\overset{R^{42}}{|}}{N}}\text{→O} \quad \text{(A-V)}$$

wherein
$R^{41}$ is a $C_6$ to $C_{30}$ hydrophobic organic radical,
$R^{42}$, $R^{43}$ are independently selected from $C_1$-$C_4$ alkyl or $C_1$-$C_4$ hydroxyalkyl.

Non-limiting examples are amine oxide surfactants, such as Aromox® of Akzo Nobel and Dehyton PL of BASF, Genaminox® of Clariant, Macat® AO of Mason Chemical Company.

Another class of suitable non-ionic acetylenic diol surfactants (A6) is represented but not limited to the surfactants with the general formula A-VI:

$$\text{(A-VI)}$$

wherein
$R^{51}$ and $R^4$ are linear or branched C3 to C10 alkyl,
$R^{52}$ and $R^{53}$ selected from H and linear or branched C1 to C5 alkyl,
q, r, s and t are integers of from 0 to 20.

Examples, but not limited to, are the Surfynol and Dynol brands of Air Products. These are known for their excellent wetting properties and mid to low surface tension.

Hydrophobizer B

The second type of additives (also referred to as hydrophobizer B, together with the surfactants A also referred to a compounds A and B) according to the present invention may be selected from any types of surfactant capable of achieving surface hydrophobization after the immersion of the target substrate, i.e. exposed or unexposed to radiation, into a solution (only) hydrophobizer B in water ("solution B") such that the water contact angle changes before and after immersion in solution B. The contact angle after immersion is increased by 5-95°, compared to the contact angle before immersion. Preferably the contact angle is increased by at least 5°, more preferably by at least 10°, even more preferably by at least 15°, even more preferably by at least 20°, even more preferably by at least 25°, most preferably by at least 30°. The higher the increase, the better is the performance of the hydrophobizer B.

The immersion time should be sufficiently long to reach a steady state. Immersion times of from about 5 s to about 5 min are generally useful. If the immersion time is too short the effect of the hydrophobizer is limited, if it is too long long it is inacceptable time consuming. Preferably the immersion time is from 10 s to 2 min. Generally, the contact angle should reach a steady state after 30 s immersion with hydrophobizer B.

The shift of the contact angle of the respective substrate is determined by measuring the contact angle of water in relation to the substrate before and after the treatment with the respective solution B. The contact angle is determined according to the method described in the User Manual of the MobileDrop™ Contact Angle Measuring Instrument, KRÜSS GmbH, Hamburg, 2006-2008.

Without being bound to any theory, inventors believe that hydrophobizer B binds to the surface and modifies the surface energy (wettability, or degree of hydrophobicity) of the patterned material, such that at the end of the rinsing phase the surface energy is lower than at the beginning.

A direct consequence and also proof that the hydrophobizer B binds to and remain on the surface can be monitored by measuring the zeta potential before, during and after the contact with the desired rinse formulation. For a good cleaning efficiency and preventing the hydrophobic particles, or dirt to re-attach on the surface it is preferred that there is a net effect of increase in the absolute magnitude of the zeta potential to higher values than that of the native surface, either towards positive or negative values.

The zeta potential, i.e. the streaming potential/current method according to ISO 13099, was determined according to the method described in the Instruction Manual for SurPass Electrokinetic Analyzer from Anton Parr GmbH, 2012, Graz, Austria.

For prevention of the particle re-deposition efficiency, it is preferred that the zeta potential shifted is by at least ±15 mV, more preferably by at least ±18 mV, even more preferably by at least ±24 mV, even more preferably by at least ±30 mV, even more preferably by at least ±35 mV, most preferably by at least ±40 mV. The higher the shift is, the better is the performance of the hydrophobizer B.

For illustration FIG. 2 shows the zeta potential of a non-exposed photoresist surface (Immersion ArF photoresist) measured by the streaming potential method, where the first bar indicates the native surface zeta potential value (−25 mV) in water+1 mM KCl (electrolyte). The second bar indicates the surface zeta potential value (+36 mV) measured in-situ in the same cell, during flow of a solution containing hydrophobizer B (cationic hydrophobizer). The zeta potential reversal from negative to positive values is clear. The third bar in the graph indicates the zeta potential of the photoresist surface after final flowing and displacing the hydrophobizer B formulation with water and 1 mM KCl, measured in situ in the same cell. The surface zeta potential value returns to a negative (−7 mV), but its magnitude is considerably lower than the native surface zeta potential (−25 mV). Based on these facts we conclude that hydrophobizer B remains on the surface even after rinsing with Water+1 mM KCl.

Preferably the hydrophobizer B alone in water may have a surface tension of from 30 mN/m to 80 mN/m, more preferably of from 35 mN/m to 75 mN/m, most preferably of from 40 mN/m to 70 mN/m.

The hydrophobizer B may be cationic, amphiphilic or zwitterionic. Preferably hydrophobizer B is cationic.

The hydrophobizer B may be a monomeric or polymeric compound. Polymeric means that the component comprises at least two monomeric units, preferably at least ten monomeric units, most preferably at least 20 monomeric units.

Preferably hydrophobizer B comprises nitrogen atoms.

The hydrophobizer B may preferably be selected from but are not limited to (B1) low quaternary alkyl ammonium surfactants,
(B2) gemini quaternary alkyl ammonium surfactants, and
(B3) polyamines.

The quaternary alkyl ammonium surfactants (B1) are of the general formula B-I

wherein $R^1$ is selected from moieties of the following formula:

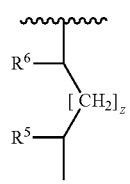

$R^2$, $R^3$, $R^4$ are selected from $R^1$ and H, $R^5$ is selected from H, OH and $C_1$ to $C_{10}$ alkyl, C1 to C6 fluoro and perfluoro alkyls, z is an integer of from 1 to 18, $R^6$ is selected from H and $C_1$ to $C_{10}$ alkyl, C1 to C6 fluoro and perfluoro alkyls.

Preferably, $R^5$ is selected from H, OH and $C_1$ to $C_6$ alkyl.

Preferably, n is an integer of from 1 to 12, more preferably from 1 to 8, most preferably from 1 to 5.

Preferably, $R^6$ is selected from H and $C_1$ to $C_8$ alkyl, more preferably from H or $C_1$ to $C_5$ alkyl, most preferably from H or $C_1$ to $C_3$ alkyl.

The gemini surfactants (B2) are of the general formula II:

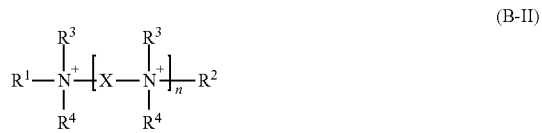

wherein:

X is a divalent group, for each repeating unit 1 to n independently selected from (a) a linear or branched $C_1$ to $C_{20}$ alkanediyl, which may optionally be substituted and which may optionally be interrupted by up to 5 heteroatoms selected from O and N, (b) a $C_5$ to $C_{20}$ cycloalkanediyl, which may optionally be substituted and which may optionally be interrupted by up to 5 heteroatoms selected from O and N, (c) a $C_6$ to $C_{20}$ organic group of formula —$X^1$-A-$X^2$—, wherein $X^1$ and $X^2$ are independently selected from a $C_1$ to $C_7$ linear or branched alkanediyl and A is selected from a $C_5$ to $C_{12}$ aromatic moiety or a $C_5$ to $C_{30}$ cycloalkanediyl, which H atoms may optionally be substituted and which C atoms may optionally be interrupted by up to 5 heteroatoms selected from O and N, and (d) a polyoxyalkylene diradical of formula B-IIa:

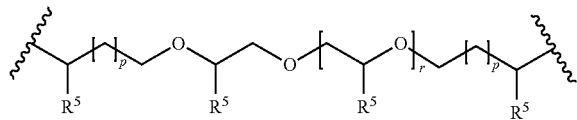

(B-IIa)

wherein p is 0 or 1, r is an integer from 1 to 100; $R^5$ is selected from H and a linear or branched $C_1$ to $C_{20}$ alkyl group, $R^1$ and $R^2$ are monovalent groups independently selected from H, linear or branched $C_1$ to $C_{20}$ alkyl, $C_5$ to $C_{20}$ cycloalkyl, $C_5$ to $C_{20}$ aryl, $C_6$ to $C_{20}$ alkylaryl, $C_6$ to $C_{20}$ arylalkyl, $C_1$ to $C_{20}$ hydroxyalkyl, or $C_2$ to $C_4$ oxyalkylene homo or copolymers, all of which may optionally be further substituted, preferably with sulfonate groups, $R^3$ and $R^4$ are monovalent groups independently selected from a linear or branched $C_5$ to $C_{30}$ alkyl group, a $C_5$ to $C_{30}$ cycloalkyl, a $C_1$ to $C_{20}$ hydroxyalkyl, and a $C_2$ to $C_4$ oxyalkylene homo or copolymers, all of which may optionally be substituted, and wherein pair-wise $R^3$-$R^4$ and adjacent $R^4$-$R^4$ and $R^3$-$R^3$ may optionally together form a bivalent group X as defined above, and may also be a continuation Q of the molecule by branching, and, if n is equal to or greater than 2, $R^3$, $R^4$ or $R^3$ and $R^4$ may also be hydrogen atoms, n is an integer from 1 to 5, or, in case at least one of X, $R^3$ and $R^4$ comprises a $C_2$ to $C_4$ polyoxyalkylene group, n may be an integer from 1 to 10000, and provided that, if at least one Q is present, n includes all repeating units of branches Q, Q is

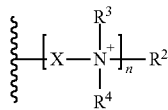

z is an integer, which is chosen so that the overall surfactant is electrically uncharged, Z is a counter-ion.

Such gemini surfactants (B2) are described in more detail in U.S. provisional patent application No. 61/669,686, which is incorporated herein by reference.

The polyamine hydrophobizers (B3) are of the general formula B-III

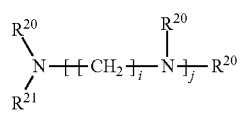

(B-III)

wherein
$R^{21}$ is H or $C_1$ to $C_{24}$ alkyl,
$R^{20}$ is H, $C_1$ to $C_{24}$ alkyl or a H—$(O(CH_2)_k)_l$-group,
i is 2 or 3,
j is an integer of from 3 to 7,
k is an integer of from 1 to 3,
l is an integer of from 1 to 30.

Such polyamine surfactants may be protonated or N-quaternized with $C_1$ to $C_{24}$ alkyl.

For example, such polyamine surfactants are described in U.S. Pat. No. 6,316,582, U.S. Pat. No. 4,126,640 and U.S. Pat. No. 4,195,152.

Other polyamine surfactants are Sokalan PG 617, Lupasol PN 50, Lupasol FG, available from BASF. Luviquat FC, Polyquart FDI, Polyquart 701, Polyquart Ampho 149, etc.

The overall composition comprising at least one surfactant A and at least one hydrophobizer B should be a one phase solution. Preferably the solution essentially consists of at least one surfactant A and at least one hydrophobizer B.

Other additives such as nitrogen containing polymers known to act as surface conditioners, i.e. attach to the surface and change its energy can be mentioned here in the form of Lugalvan™ P, Trilon™ types, Lutropur LMM, Sokalan™ HP types, Counterions Z may have to be present for neutrality reasons along with the surfactants B. Without being bound to any theory, it is believed that surfactant A ensures a good wettability of the rinse solution comprising surfactant A and hydrophobizer B in the initial phase with a low equilibrium and, or dynamic surface tension, while hydrophobizer B can attach to the surface and change its energy from a higher (hydrophilic) to a lower (hydropober) value such that the cleaning liquid is quickly dried with minimal capillary stress on the structure during spin off. Furthermore the Zeta potential will change towards a higher absolute value during rinse as compared to the Zeta potential of the native surface.

The properties of the solution can be adjusted by changing the concentration of A and B and their proportion.

The concentration of the surfactants A and B in the aqueous solution primarily depends on the critical micelle concentration value (CMC value). Therefore, the concentration can vary broadly and, therefore, can be adapted most advantageously to the particular requirements of a given method of the invention. Preferably, the concentration is in the range of 0.00005 to 3% by weight, more preferably 0.0005 to 0.1% by weight, and most preferably 0.001 to 0.5% by weight, the weight percentages being based on the overall weight of the solution.

The proportion by weight between surfactant A and hydrophobizer B may be from 1 to 500 to 500:1, preferably from 1 to 200 to 200:1, most preferably from 1 to 50 to 50:1.

There may be one or more surfactants A and one or more surfactants B in the solution. In a preferred embodiment there is one surfactant A and two or more surfactants B in the solution. In another preferred embodiment there are two or more surfactants A and one hydrophobizer B in the solution. If more than one surfactant A and/or hydrophobizer B are used the combination of the surfactants or hydrophobizers, respectively, must fulfil the requirements according to the present invention. Preferably also each of the surfactants A and hydrophobizers B do fulfil the requirements In a preferred embodiment a non-ionic fluorinated surfactant may be combined with a Tri-alkyl methyl ammonium compound.

In another preferred embodiment alkoxylated non-ionic surfactants A1 may be combined with a Tri-alkyl methyl ammonium compound B1, optionally in combination with a nonionic branched fluorinated surfactant A2.

In yet another preferred embodiment a non-ionic fluorinated surfactant A1 may be combined with a Tri-alkyl methyl ammonium compound B1, optionally in combination with an amine oxide surfactant A2.

In yet another preferred embodiment an acetylenic diol non-ionic surfactant A1 may be combined with a Tri-alkyl methyl ammonium compound B1, optionally in combination with an amine oxide surfactant A2.

In yet another preferred embodiment an anionic branched fluorinated surfactant A1 may also be combined with a gemini compound B1, optionally in combination with an alkyl amine oxide surfactant A2.

In yet another preferred embodiment an alkyl amine oxide surfactant A1 may be combined with a Tri-alkyl methyl ammonium compound B1 and, or a gemini compound B2.

The aqueous solution may contain water-miscible polar organic solvents. Examples of suitable solvents are described in US 2008/0280230 A, page 2, paragraph [0016].

Preferably the aqueous solution does not contain organic solvents in concentrations more than 5% by weight, more preferably 1% by weight, and most preferably, the aqueous solution does not contain any organic solvents.

Further additive may be present in the cleaning solution according to the present invention. Such additives may be
(I) isobutyl alcohol, tert-butyl alcohol and alcohols in general to improve the wetting capabilities and or solubility of the components,
(II) buffer components for pH adjustment such as but not limited to $(NH_4)_2CO_3/NH_4OH$, $Na_2CO_3/NaHCO_3$, tris-hydroxymethyl-aminomethane/HCl, $Na_2HPO_4/NaH_2PO_4$,
(III) One or more further surfactants, either non-ionic, or, anionic to improve surface tension and solubility of the mixture, or
(IV) Dispersants to prevent the surface re-attachment of the removed particles of dirt or polymer.

In accordance with the method of the invention, the aqueous solution comprising the two different types of surfactants may be used for different purposes and objects. Thus, it may be used as an immersion liquid for immersing photoresists during irradiation with actinic light through a mask, as a developer solution for photoresist layers exposed to actinic radiation through a mask and as a chemical rinse solution for rinsing the patterned material layers.

In one embodiment, the method for manufacturing integrated circuit devices, optical devices, micromachines and mechanical precision devices has been found, the said method comprising the steps of
(1) providing a substrate having patterned material layers having line-space dimensions of 50 nm and less and aspect ratios of greater or equal 2,
(2) contacting the substrate at least once with an aqueous, solution containing at least a surfactant A and a hydrophobizer B as described herein, and
(3) removing the aqueous solution from the contact with the substrate.

In the third step of the method according to the invention, the aqueous solution is removed from the contact with the substrate. Any known methods customarily used for removing liquids from solid surfaces can be employed.

Preferably, in the first step of the method of the invention, the substrate is provided by a photolithographic process comprising the steps of
(i) providing the substrate with an immersion photoresist, EUV photoresist or eBeam photoresist layer,
(ii) exposing the photoresist layer to actinic radiation through a mask with or without an immersion liquid,
(iii) developing the exposed photoresist layer with a developer solution to obtain a pattern having line-space dimensions of 50 nm and less, in particular, of 32 nm and less and, most especially, of 22 nm and less and an aspect ratio above 2, preferably above 10, even more preferably 50 and, most preferably, up to 75,
(iv) applying a chemical rinse solution to the developed patterned photoresist layer, and
(v) drying the semiconductor substrate after the application of the chemical rinse, solution preferably by spin drying or drying processes making use of the Marangoni effect.

Any customary and known immersion photoresist, EUV photoresist or eBeam photoresist can be used. The immersion photoresist may already contain at least one of the compounds A or B or a combination thereof. Additionally, the immersion photoresist can contain nonionic surfactants. Suitable nonionic surfactants are described, for example, in US 2008/0299487 A1, page 6, paragraph [0078]. Most preferably, the immersion photoresist is a positive resist.

Beside e-Beam exposure or extreme ultraviolet radiation of approx. 13.5 nm, preferably, UV radiation of the wavelength of 193 nm is used as the actinic radiation.

In case of immersion lithography preferably, ultra-pure water is used as the immersion liquid.

Any customary and known developer solution can be used for developing the exposed photoresist layer. Preferably, aqueous developer solutions containing tetramethylammonium hydroxide (TMAH) are used.

Preferably, the chemical rinse solutions are aqueous solutions.

Preferably, the chemical rinse solutions are applied to the exposed and developed photoresist layers as puddles.

It is essential for photolithographic process according to the method of the invention, that at least one of the following: the immersion solution, the developer solution or the chemical rinse solution contains at least one surfactant A and at least one additive B. Most preferably, the combination of surfactant(s) A and hydrophobizer(s) B is contained in the chemical rinse solution.

Customary and known equipment customarily used in the semiconductor industry can be used for carrying out the photolithographic process in accordance with the method of the invention.

BRIEF DESCRIPTION OF THE DRAWINGS

As FIG. 1 is of exemplary nature, the depicted spatial and dimensional relationships are not to be construed as an exact replica of the practical conditions.

In the Figures the reference numbers have the following meaning:
1 substrate,
2 photoresist patterns or high aspect ratio stack (HARS), and
4 cleaning solution containing no surfactant/hydrophobizer.

FIG. 4 shows the result of a rinse treatment by using the hydrophobizer B1 according to comparative example 2.

EXAMPLES

Silicon wafers were provided with 1000 nm thick layers of an immersion photoresist. The photoresist layers were exposed to UV radiation of a wavelength of 193 through a mask using ultrapure water as the immersion liquid. The mask contained features having dimensions of 22 nm. Thereafter, the exposed photoresist layers were baked and developed with an aqueous developer solution containing TMAH. The baked and developed photoresist layers were subjected to a chemical rinse treatment using a chemical rinse solution containing surfactant A, surfactant B and surfactant A+surfactant B in different proportions.

The following compounds were used in the examples:
A1: Fluorinated surfactant (non-ionic),
B1: Tri-(C>6) alkyl methyl ammonium salt,
A2: (C>10) alkyl amine oxide surfactant (non-ionic), and
A3: Alkene acetylenic diol (non-ionic).

Each chemical rinse solution was applied as a puddle. Thereafter, the silicon wafers were spun dry. The dried silicon wafers did not show any watermarks. It could be corroborated by scanning electron microscopy (SEM) and atomic force microscopy (AFM) that the dried patterned photoresist layers having patterns with line-space dimensions, Line width 26 nm, Space width 52 nm and an aspect ratio of about 4 did not show any pattern collapse.

The results are depicted in FIGS. 3 to 7.

Comparative Example 1

The manufacture of patterned photoresist layers having challenging feature dimensions with line-space structures and line-width of 26 nm and an aspect ratio of about 4 using non-ionic surfactant A1. The space between the photoresist lines was 52 nm [L (line) 26 nm P (pitch) 78 nm].

Figure 1:
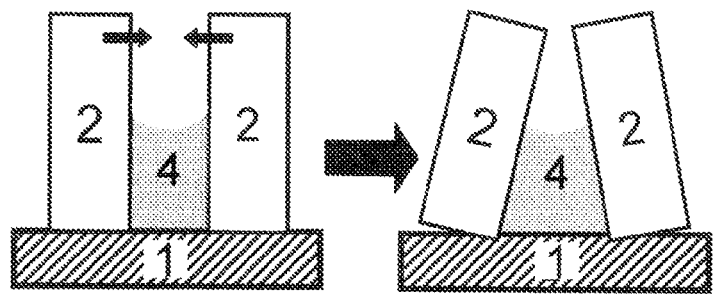
FIG. 1 illustrates how the photoresist structures or a high aspect ratio stacks 2 are drawn towards each other by the capillary forces of the evaporating cleaning solution 4, which capillary forces lead to pattern collapse.
Figure 2:
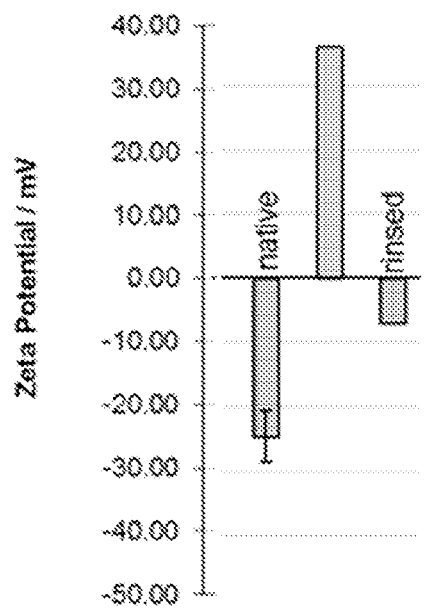
FIG. 2 shows the shift of the Zeta potential of the surface of a photoresist with a negatively charged surface to a more positive and higher magnitude Zeta potential by using the cleaning compositions according to the present invention.
Figure 3:
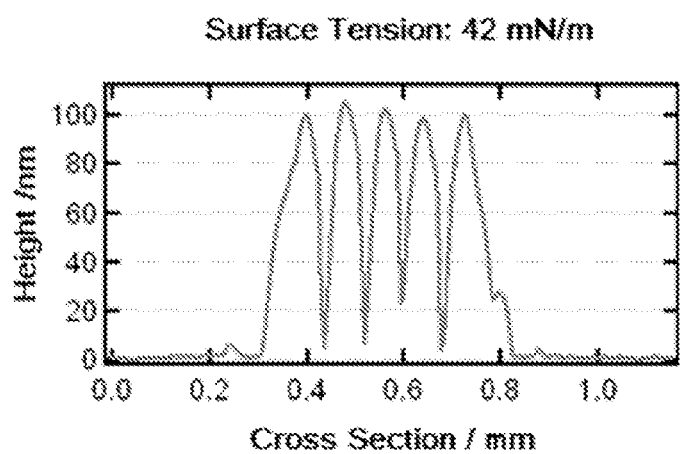
FIG. 3 shows the results of a rinse treatment by using the non-ionic surfactant A1 according to comparative example 1.

Silicon wafers were provided with 100 nm thick layers of an immersion photoresist. The photoresist layers were exposed to UV radiation of a wavelength of 193 through a mask using ultrapure water as the immersion liquid. Thereafter, the exposed photoresist layers were baked and developed with an aqueous developer solution containing tetramethylammonium hydroxide (TMAH). The baked and developed photoresist layers were subjected to a chemical rinse treatment using three alternative chemical rinse solutions containing different concentration of ACFS 002 surfactant, i.e 0. 0.00005, 0.0002 and 0.0004% by weight with a consequent decrease in surface tension from 42 mN/m to 22 mN/m and to 21 mN/m, respectively. FIG. 3 shows the respective height profile measured by AFM after the rinse treatment by using surfactant ACFS 002. The concentration increases from left to right, 0.00005 and 0.0002 wt. %, with a consequent decrease in surface tension from 42 mN/m to 22 mN/m, without significant effect on pattern collapse. The dried patterned photoresist layers having patterns with line-space dimensions of 26 nm and an aspect ratio of about 4 showed significant pattern collapse.

Comparative Example 2

Example 1 was repeated except that hydrophobizer B was used instead of surfactant A1 in the chemical rinse solution. The surface tension of the 0.002% by weight concentrated solution was around 44 mN/m.

FIG. 4 shows the respective height profile measured by AFM after the rinse treatment by using hydrophobizer B1 and the formulation surface tension of about 44 mN/m. The dried patterned photoresist layers having photoresist linewidth dimensions of 26 nm and an aspect ratio of about 4 showed significant pattern collapse.

Example 3

Example 1 was repeated except that combination of non-ionic surfactant A1 and hydrophobizer B1 instead of surfactant A1 alone was used in the three different chemical rinse solutions. Furthermore, the concentration of the A1 was varied, with the same values according to Example 1, i.e. 0.00005 and 0.0002% by weight, while the concentration of the B1 compound was kept constant, with the same value, 0.002% by weight, as in the comparative Example 2. The surface tension of the rinse formulations also decreased with the increase of the amount of surfactant A1 from 32 to 26 mN/m.

Figure 5:
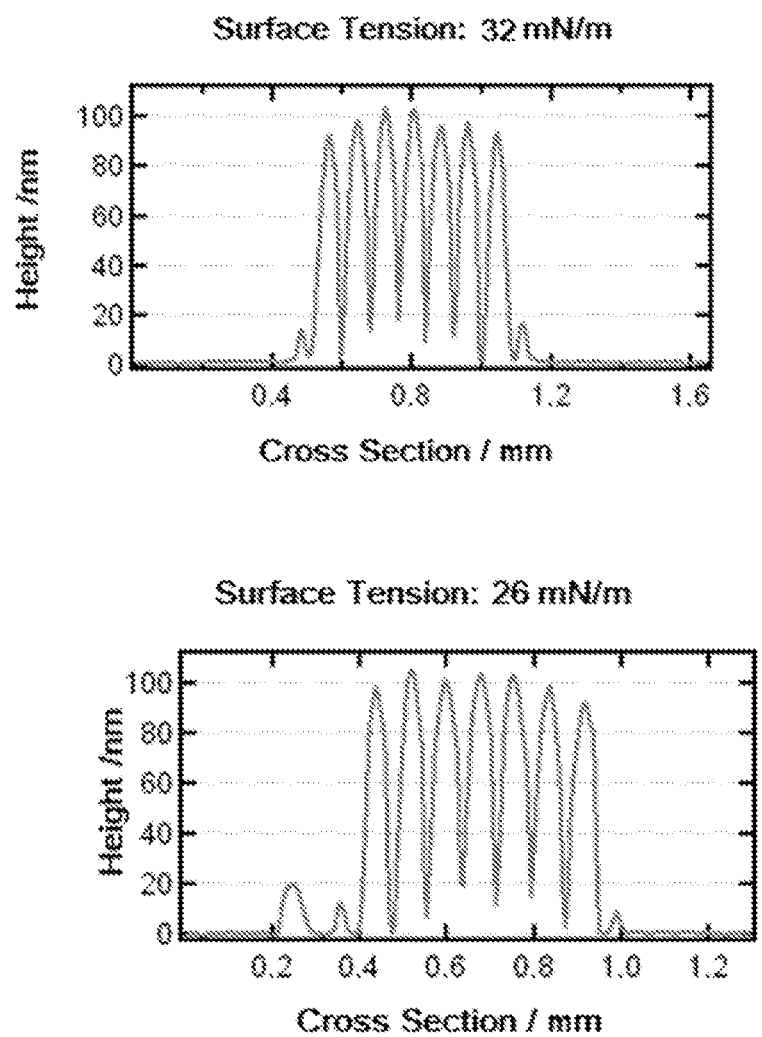
FIG. 5 shows the result of a rinse treatment according to example 3 by using a composition comprising the surfactant A1, as used in comparative example 1 in combination with the hydrophobizer B1, as used in comparative example 2.
Figure 6:
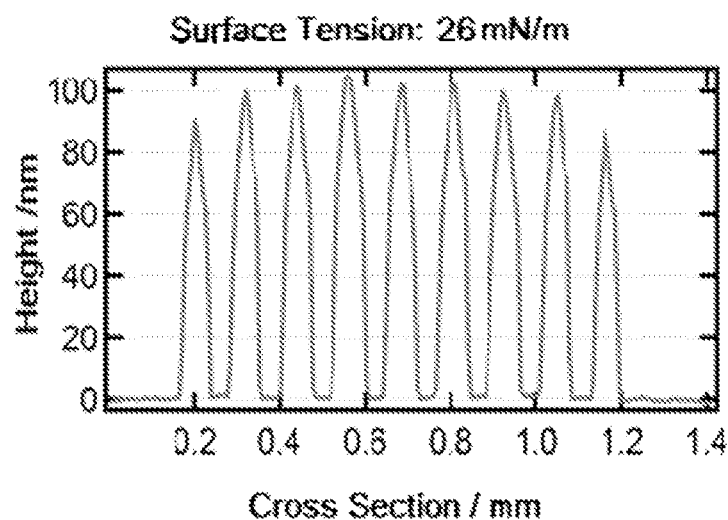
FIG. 6 shows the result of a rinse treatment according to example 4 by using a composition comprising the surfactants A2 and A3 in combination with the hydrophobizer B1 as used in comparative example 5.

FIG. 5 shows the respective height profile measured by AFM after the rinse treatment by using the combination of additives A1 and B1. The dried patterned photoresist layers having photoresist line-width dimensions of 26 nm and an aspect ratio of about 4 shows significantly reduced or no pattern collapse.

Example 4

Example 1 was repeated except that different line-space photoresist structures were used, namely with a line-width of 40 nm, pitch of 120 nm, an aspect ratio of about 2 obtained from a 100 nm thick photoresist layer. The space between the photoresist lines was 80 nm [L (line) 40 nm P (pitch) 120 nm]. Furthermore an aqueous rinse composition comprising additives A2:A3:B1 in a weight ratio of 2.5:2.5:1 was used. The results are presented in the FIG. 6, where no collapse is observed.

Comparative Example 5

Figure 7:
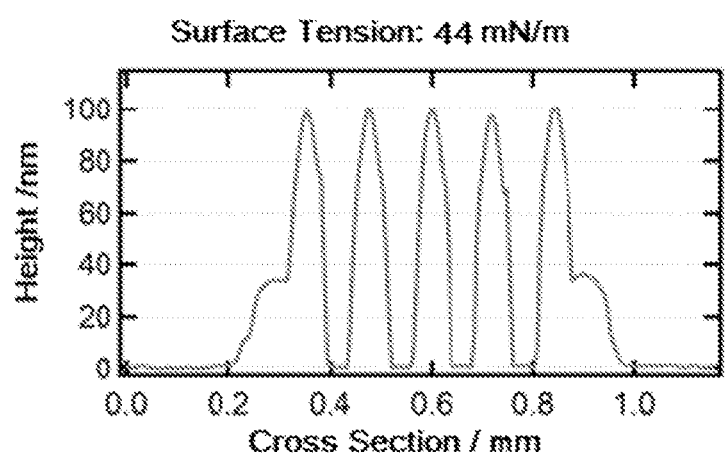
FIG. 7 shows the results of a rinse treatment by using a composition comprising hydrophobizer B1 according to comparative example 5.

Example 4 was repeated except that the aqueous rinse formulation comprised only additive B1 in an amount of 0.002% by weight, the same concentration of B1 as used in Example 4. The surface tension of the solution was around 44 mN/m. The results are shown in the FIG. 7. In contrast to example 4 (FIG. 6), in which an anionic surfactant was used, FIG. 7 shows strong pattern collapse.

TABLE 1

| Example | Surfactant A | Hydrophobizer B | Number of non-collapsed lines |
| --- | --- | --- | --- |
| 1 (comparative) | A1 | none | 5 |
| 2 (comparative) | none | B1 | 5 |
| 3 | A1 | B1 | 7 |
| 4 | A2 + A3 | B1 | 8 |
| 5 (comparative) | none | B1 | 5 |

The invention claimed is:
1. A method for treating a substrate including patterns having line-space dimensions of 50 nm or below, the method comprising rinsing the substrate with an aqueous composition comprising at least one non-ionic surfactant A and at least one hydrophobizer B, wherein

(a) the at least one surfactant A has an equilibrium surface tension of 10 mN/m to 35 mN/m, determined from a solution of the at least one surfactant A in water at the critical micelle concentration, and
(b) the at least one hydrophobizer B is selected so that the contact angle of water to the substrate is increased by contacting the substrate with a solution of the hydrophobizer B in water by 5-95° compared to the contact angle of water to the substrate before such contacting.

2. The method according to claim 1, wherein the at least one surfactant A has an equilibrium contact angle to the substrate of 0° to 30°.

3. The method according to claim 2, wherein the at least one surfactant A is selected from the group comprising short branched perfluoroalkyl surfactants (A1), Silicon based surfactants (A2), alkoxy terminated copolymers of ethylene oxide and propylene oxide surfactants (A3), alkyl polyglycoside and sorbate surfactants (A4), alkyl amine oxide surfactants (A5), and acetylenic diol surfactants (A6).

4. The method according to claim 3, wherein the short branched perfluoroalkyl surfactants (A1) comprise at least three short-chain perfluorinated groups $R^f$ selected from trifluoromethyl, pentafluoroethyl, 1-heptafluoropropyl, 2-heptafluoropropyl, and pentafluorosulfanyl.

5. The method according to claim 3, wherein the silicon based surfactants (A2) are selected from the group comprising siloxane surfactants of general formula A-IIa and A-IIb:

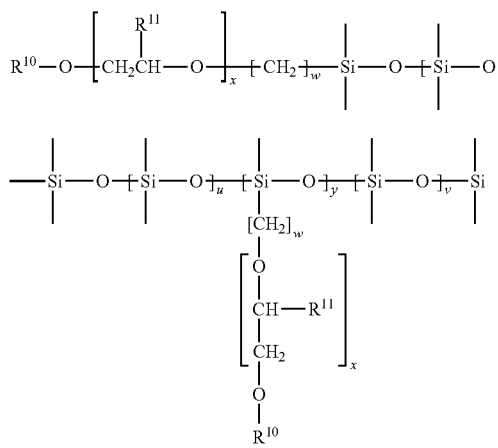

wherein
u, v are an integers independently selected of from 0 to 5,
w is an integer of from 0 to 6,
x is an integer of from 1 to 22,
y is an integer of from 1 to 5,
$R^{10}$ is a selected from H or a $C_1$ to $C_{10}$ alkyl group, and
$R^{11}$ is selected from H, methyl or ethyl.

6. The method according to claim 3, wherein the alkoxy terminated copolymers of ethylene oxide and propylene oxide surfactants (A3) have the general formula A-III $$(R^{12}-O)_c\text{-}(EO)_a(PO)_bH \quad \text{(A-III)}$$

wherein
$R^{12}$ is a c-valent group selected from $C_4$ to $C_{30}$ alkyl, which may optionally be fluorinated or perfluorinated,
EO oxyethanediyl,
PO oxypropanediyl,
a is an integer of from 1 to 100,
b is an integer of from 0 to 100, and
c is an integer of from 1 to 6.

7. The method according to claim 3, wherein the alkyl polyglycoside surfactants (A4) has the general formula A-IV $$R^{21}O(C_nH_{2n}O)_j(Z)_k \quad \text{(A-IV)}$$

wherein
$R^{21}$ is a hydrophobic group selected from the group consisting of alkyl, alkylphenyl, hydroxyalkylphenyl, in which the alkyl group contain from about 10 to 18,
n is preferably 2 or 3,
j is from 0 to 10,
k is from 1 to 8, and
Z is selected from a hexose, a glucose, a derivative of glucose, a sucrose.

8. The method according to claim 3, wherein the alkyl amine oxide surfactants (A5) has the general formula A-V

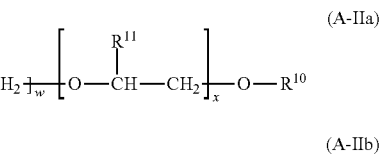

wherein
$R^{41}$ is a $C_6$ to $C_{30}$ hydrophobic organic radical,
$R^{42}$, $R^{43}$ are independently selected from $C_1$-$C_4$ alkyl or $C_1$-$C_4$ hydroxyalkyl.

9. The method according to claim 3, wherein the acetylenic diol surfactants (A6) has the general formula A-VI

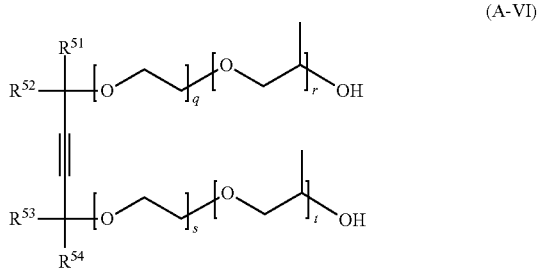

wherein
$R^{51}$ and $R^4$ are linear or branched $C_3$ to $C_{10}$ alkyl,
$R^{52}$ and $R^{53}$ selected from H and linear or branched $C_1$ to $C_5$ alkyl, and
q, r, s and t are integers of from 0 to 20.

10. The method according to claim 1, wherein the at least one hydrophobizer B is selected so that the contact angle of water to the substrate is increased by contacting the substrate with a solution of the at least one hydrophobizer B in water by at least 10° compared to the contact angle of water to substrate before such contacting.

11. The method according to claim 1, wherein the hydrophobizer B has an equilibrium surface tension of 30 mN/m to 70 mN/m.

12. The method according to claim 1, wherein the hydrophobizer B is cationic, amphiphilic or zwitterionic.

13. The method according to claim 1, wherein the hydrophobizer B is selected from the group comprising quaternary alkyl ammonium compound (B1), gemini quaternary alkyl ammonium compound (B2), and polyamines (B3).

14. The method according to claim 13, wherein the quaternary alkyl ammonium compound (B1) has the general formula B-I

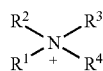
(B-1)

wherein
$R^1$ is selected from moieties of the following formula:

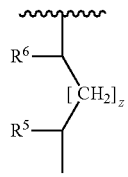

$R^2$, $R^3$, $R^4$ are selected from $R^1$ and H,
$R^5$ is selected from H, OH and $C_1$ to $C_{10}$ alkyl,
z is an integer of from 1 to 18,
$R^6$ is selected from H and $C_1$ to $C_{10}$ alkyl.

15. The method according to claim 13, wherein the gemini quaternary alkyl ammonium compounds B2 has the general formula B-II:

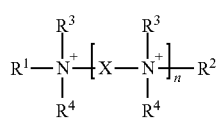
(B-II)

wherein
X is a divalent group, for each repeating unit 1 to n independently selected from
(a) a linear or branched $C_1$ to $C_{20}$ alkanediyl, which may optionally be substituted and which may optionally be interrupted by up to 5 heteroatoms selected from O and N,
(b) a $C_5$ to $C_{20}$ cycloalkanediyl, which may optionally be substituted and which may optionally be interrupted by up to 5 heteroatoms selected from O and N, (c) a $C_6$ to $C_{20}$ organic group of formula $—X^1$-A-$X^2—$, wherein $X^1$ and $X^2$ are independently selected from a $C_1$ to $C_7$ linear or branched alkanediyl and A is selected from a $C_5$ to $C_{12}$ aromatic moiety or a $C_5$ to $C_{30}$ cycloalkanediyl, which H atoms may optionally be substituted and which C atoms may optionally be interrupted by up to 5 heteroatoms selected from O and N, and
(d) a polyoxyalkylene diradical of formula II:

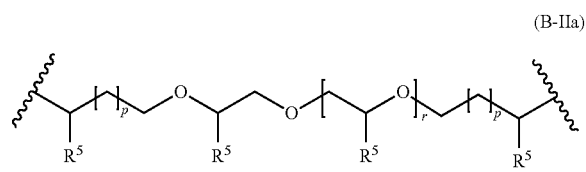
(B-IIa)

wherein p is 0 or 1, r is an integer from 1 to 100; $R^5$ is selected from H and a linear or branched $C_1$ to $C_{20}$ alkyl group,
$R^1$ and $R^2$ are monovalent groups independently selected from H, linear or branched $C_1$ to $C_{20}$ alkyl, $C_5$ to $C_{20}$ cycloalkyl, $C_5$ to $C_{20}$ aryl, $C_6$ to $C_{20}$ alkylaryl, $C_6$ to $C_{20}$ arylalkyl, $C_1$ to $C_{20}$ hydroxyalkyl, or $C_2$ to $C_4$ oxyalkylene homo or copolymers, all of which may optionally be further substituted,
$R^3$ and $R^4$ are monovalent groups independently selected from a linear or branched $C_5$ to $C_{30}$ alkyl group, a $C_5$ to $C_{30}$ cycloalkyl, a $C_1$ to $C_{20}$ hydroxyalkyl, and a $C_2$ to $C_4$ oxyalkylene homo or copolymers, all of which may optionally be substituted, and wherein pair-wise $R^3$-$R^4$ and adjacent $R^4$-$R^4$ and $R^3$-$R^3$ may optionally together form a bivalent group X as defined above, and may also be a continuation Q of the molecule by branching, and, if n is equal to or greater than 2, $R^3$, $R^4$ or $R^3$ and $R^4$ may also be hydrogen atoms,
n is an integer from 1 to 5, or, in case at least one of X, $R^3$ and $R^4$ comprises a $C_2$ to $C_4$ polyoxyalkylene group, n may be an integer from 1 to 10000, and provided that, if at least one Q is present, n includes all repeating units of branches Q,
Q is

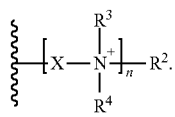

16. The method according to claim 13, wherein the polyamines (B3) have the general formula B-III

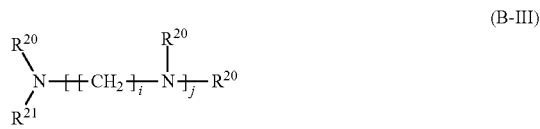
(B-III)

wherein
$R^{21}$ is H or $C_1$ to $C_{24}$ alkyl or alkenyl,
$R^{20}$ is H, $C_1$ to $C_{24}$ alkyl or a H—$(O(CH_2)_k)_l$-group,
i is 2 or 3,
j is an integer of from 3 to 7, k is an integer of from 1 to 3, l is an integer of from 1 to 5.

17. The method according to claim 1, wherein the hydrophobizer B shifts the zeta potential of the surface at least 10 mV towards a more positive potential.

18. A method for manufacturing an integrated circuit device, an optical device, a micromachine and a mechanical precision device, the method comprising:

contacting a substrate having patterned material layers having line-space dimensions of 50 nm or less and aspect ratios of greater than or equal to 2 with an aqueous solution comprising at least one surfactant A and at least one hydrophobizer B, (a) the at least one surfactant A having an equilibrium surface tension of 10 mN/m to 35 mN/m, determined from a solution of the at least one surfactant A in water at the critical micelle concentration, and (b) the at least one hydrophobizer B being selected so that the contact angle of water to the substrate is increased by contacting the substrate with a solution of the hydrophobizer B in water by 5-95° compared to the contact angle of water to the substrate before such contacting and removing the aqueous solution from contact with the substrate.

19. The method according to claim 18, wherein the patterned material layers have line-space dimensions of 32 nm or less and aspect ratios of 10 or greater for non-photoresist structures and aspect ratios of 2 or greater for photoresist structures.

20. The method according to claim 18, wherein the patterned material layers are selected from the group consisting of patterned developed photoresist layers, patterned barrier material layers, patterned multi-stack material layers and pattern dielectric material layers.

21. The method according to claim 18, wherein the solution contains, based on a complete weight of the solution, 0.0005 to 1% by weight of the surfactant A and 0.0005 to 1% by weight of the hydrophobizer B.

22. The method according to claim 18, wherein the substrate is provided by a photolithographic process comprising the steps of (i) providing the substrate with an immersion photoresist, EUV photoresist or eBeam photoresist layer, (ii) exposing the photoresist layer to actinic radiation through a mask with or without an immersion liquid, (iii) developing the exposed photoresist layer with a developer solution to obtain a pattern having line-space dimensions of 32 nm and less and an aspect ratio>2, (iv) applying a chemical rinse solution to the developed patterned photoresist layer, and (v) spin drying the semiconductor substrate after the application of the chemical rinse solution;

wherein at least one of the following: the immersion liquid, the developer solution and the chemical rinse solution, is an aqueous solution comprising the at least one surfactant A and the at least one hydrophobizer B.

* * * * *